(12) United States Patent
Kolesar

(10) Patent No.: US 6,691,513 B1
(45) Date of Patent: Feb. 17, 2004

(54) SYSTEM AND METHOD FOR PROVIDING AN IMPROVED ELECTROTHERMAL ACTUATOR FOR A MICRO-ELECTRO-MECHANICAL DEVICE

(75) Inventor: Edward S. Kolesar, Fort Worth, TX (US)

(73) Assignee: PC Lens Corporation, Dallas, TX (US)

( * ) Notice: Subject to any disclaimer, the term of this patent is extended or adjusted under 35 U.S.C. 154(b) by 0 days.

(21) Appl. No.: 10/222,124

(22) Filed: Aug. 16, 2002

(51) Int. Cl.$^7$ ................................................ F01B 29/10
(52) U.S. Cl. ......................... 60/527; 60/528; 310/306; 310/309
(58) Field of Search ................... 60/527, 528; 310/306, 310/307, 309

(56) References Cited

U.S. PATENT DOCUMENTS 2,518,941 A * 8/1950 Satchwell et al. ............. 60/528
5,781,331 A * 7/1998 Carr et al. ................... 359/288
6,483,419 B1 * 11/2002 Weaver et al. ................. 60/528

OTHER PUBLICATIONS

Kolesar, Edward S., et al.; "Thermally Actuated Microbeam for Large In–Plane Mechanical Deflections"; 1999 American Vacuum Society; J. Vac. Sci. Technol. A. 17(4), Jul./Aug. 1999; pp. 2257–2263.

Howard, Jeffery T., et al.; "Design, Fabrication and Performance Evaluation of a Microelectromechanical Systems (MEMS) Actuator for Gripping and Focusing a Polymeric Lens"; 1999 ASEE/GSW Proceedings; pp. 1–8.

Kolesar, E. S., et al.; "Thermally–Actuated Cantilever Beam for Achieving Large In–Plane Mechanical Deflections"; Thin Solid Films 355–356 (1999); pp. 295–302.

Kolesar, Edward S., et al.; "Thermally–Actuated Beam Used to Achieve Large In–Plane Mechanical Forces and Deflections"; Proceedings of the 45th International Instrumentation Symposium; May 2–6, 1999; pp. 531–540.

Allen, Peter B., et al.; Design, Finite Element Analysis, and Experimental Performance Evaluation of a Thermally–Actuated Beam Used to Achieve Large In–Plane Mechenical Deflections; Technical Digest; Solid–State Sensor and Actuator Workshop; Jun. 8–11, 1998; pp. 5–6.

Kolesar, Edward S., et al.; In–Plane Tip Deflection and Force Achieved With Asymmetrical Polysilicon Electrothermal Microactuators; Thin Solid Films 377–378 (2000) 719–726.

Gottert, J., et al.; "High Aspect Ratio Microfabrication at Louisiana State University"; TEXMEMS II; Second Texas–Area Workshop on Microelectromechanical Systems; May 16, 2000; pp. 11–12.

(List continued on next page.)

Primary Examiner—Sheldon J. Richter

(57) ABSTRACT

A system and method for providing an improved micro-electro-mechanical (MEMS) electrothermal actuator is disclosed. In prior art electrothermal actuators an electric current passes through a narrow arm and returns through a wide arm. The larger current density in the narrow arm heats the narrow arm so that it expands more than the wide arm. The differential expansion of the hot narrow arm and the cold wide arm deflects the end of the cold wide arm. The present invention provides an additional hot arm to provide a return path for the electric current so that the cold arm does not conduct electric current. The present invention optimizes power consumption, tip deflection and generated force. A bidirectional thermal beam actuator is also disclosed.

18 Claims, 13 Drawing Sheets

OTHER PUBLICATIONS

Allen, P. B., et al.; "Single–and Double–Hot Arm Polysilicon Surface Micromachined Electrothermal Actuators Applied to Realize a Microengine"; Solid–State Sensor and Actuator Workshop; Jun. 4–8, 2000, 2 pages.

Allen, P. B., et al.; "Theoretical and Experimental Characterization of the In–Plane Tip Force and Deflection Achieved With Asymmetrical Polysilicon Electrothermal Microactuators"; Micromachined Devices and Components VI; Sep. 18–19, 2000; vol. 4176; pp. 148–158.

Kolesar, E. S.; "Development of a Surface Micromachined Electrothermal Microengine"; MetroCon 2000—Enabling Technologies Track; MicroElectroMechanical Systems Workshop; Sep. 27, 2000; 9 pages.

Kahn, H.; "Materials Science of Microelectromechanical Systems (MEMS) Devices III"; Materials Research Society Symposium Proceedings vol. 657; Nov. 27–28, 2000, pp. EE5.34.1–EE5.34.6.

Kolesar, E. S., et al.; "Three–Dimensional Structures Assembled From Polysilicon Surface Micromachined Components Containing Continuous Hinges and Microrivets"; Thin Solid Films 398–399 (2001) pp. 566–571.

Kolesar, E. S., et al.; "Design and Performance of a Polysilicon Surface Micromachined Microengine Realized With Arrays of Asymmetrical Electrothermal Microactuators"; MEMS Design, Fabrication, Characterization, and Packaging; Proceedings of SPIE; SPIE—The International Society of Optical Engineering; May 30–Jun. 1, 2001; pp. 310–321.

Kolesar, E. S.,et al.; "Evaluation of Latchable, Three–Dimensional, Microelectromechanical Systems (MEMS) Structures Containing Continuous Hinges and Microrivets"; IEEE Dallas Section; Emerging Technologies Symposium 2001 IEEE Emerging Technologies Symposium on Broadband Communications for the Internet Era Symposium Digest; Sep. 10–11, 2001; pp. 74–78.

Kolesar, E. S., et al.; "Three–Dimensional Microelectromechanical Systems (MEMS) Structures Which Can Be Assembled for Biotechnology Applications"; Biotechnology and Nano–Biotechnology; Challenges and Opportunities of Drug Targeting in the Post–Genomic Era; Oct. 18, 2001; pp. 16–17.

Kolesar, E. S., et al.; "Surface Micromachined Polysilicon Components Containing Continuous Hinges and Microrivets Used to Realize Three–Dimensional MEMS Structures"; Materials Research Society Symposium Proceedings vol. 687; Materials Science of Microelectromechanical Systems (MEMS) Devices IV; Nov. 25–28, 2001: pp. 83–87

Kolesar, E. S., et al.; "Use of Continuous Hinges and Microrivets to Facilitate the Assembly of Three–Dimensional Polysilicon Microelectromechnical Systems (MEMS) Structures"; Microfabricated Systems and MEMS VI; Electrochemical Society Proceedings vol. 2002–6; pp. 84–89.

* cited by examiner

US 6,691,513 B1

SYSTEM AND METHOD FOR PROVIDING AN IMPROVED ELECTROTHERMAL ACTUATOR FOR A MICRO-ELECTRO-MECHANICAL DEVICE

CROSS-REFERENCE TO RELATED APPLICATIONS

The present invention is related to that disclosed and claimed in the following United States Non-Provisional Patent Applications:

Ser. No. 10/222,246, filed concurrently herewith, entitled "SYSTEM AND METHOD FOR FOCUSING AN ELASTICALLY DEFORMABLE LENS."

Ser. No. 10/222,694, filed concurrently herewith, entitled "SYSTEM AND METHOD FOR PROVIDING A MICRO-ELECTRO-MECHANICAL MICROENGINE ASSEMBLY."

The patent applications set forth above are commonly assigned to the assignee of the present invention. The disclosures in these related patent applications are hereby incorporated by reference for all purposes as if fully set forth herein.

TECHNICAL FIELD OF THE INVENTION

This invention generally relates to micro-electro-mechanical systems (MEMS) and, in particular, to an improved electrothermal actuator for a micro-electro-mechanical device.

BACKGROUND OF THE INVENTION

Electrothermal actuators are used in micro-electro-mechanical devices to provide force to move elements of the micro-electro-mechanical device. Electrothermal actuators use ohmic heating (also referred to as Joule heating) to generate thermal expansion and movement. Electrothermal actuators are typically capable of providing lateral deflections of eight microns (8 $\mu$m) to ten microns (10 $\mu$m). A micron is one millionth of a meter. Electrothermal actuators typically require drive voltages of approximately five volts (5 v).

FIG. 1 illustrates a perspective view of a prior art thermal beam actuator 100 mounted on a dielectric substrate 110. Micro-electro-mechanical systems (MEMS) technology is used to form thermal beam actuator 100 from a layer of polysilicon deposited on a dielectric substrate 110 such as silicon nitride. The components of thermal beam actuator 100 are formed from a common layer of polysilicon.

Thermal beam actuator 100 comprises first arm 120 and second arm 130. First arm 120 and second arm 130 are joined together at one end with a rigid polysilicon mechanical link 140. The end of thermal beam actuator 100 that comprises mechanical link 140 is able to move laterally and parallel to the surface of substrate 110. This end of thermal beam actuator 100 is therefore referred to as the "free" end.

The other end of first arm 120 is coupled to anchor 150 and the other end of second arm 130 is coupled to anchor 160. Anchor 150 and anchor 160 are in turn coupled to substrate 110. This end of thermal beam actuator 100 is therefore referred to as the "fixed" end.

As shown in FIG. 1, thermal beam actuator 100 is formed having portions that define a gap 170 between first arm 120 and second arm 130. Gap 170 is formed by an interior edge of first arm 120 and by an interior edge of second arm 130. The width of gap 170 is determined by the width of mechanical link 140. Air in gap 170 provides electrical insulation between first arm 120 and second arm 130.

The width of second arm 130 is greater than the width of first arm 120 for most of the length of thermal beam actuator 100. As shown in FIG. 1, thermal beam actuator 100 is formed having portions that define a flexure portion 180 of second arm 130. Flexure portion 180 usually has a width that is the same width as first arm 120. A first end of flexure portion 180 is attached to anchor 160 and a second end of flexure portion 180 is attached to the end of the wide portion of second arm 130 that is adjacent to flexure portion 180.

Electric current (from an electrical source not shown in FIG. 1) may be passed through anchor 150, through first arm 120, through mechanical link 140, through second arm 130, through flexure portion 180, through anchor 160, and back to the electrical source. Alternatively, electric current (from an electrical source not shown in FIG. 1) may be passed through anchor 160, through flexure portion 180, through second arm 130, through mechanical link 140, through first arm 120, through anchor 150, and back to the electrical source.

Because the width of first arm 120 is narrower than the width of second arm 130 (with the exception of flexure portion 180), the current density in first arm 120 will be greater than the current density in the wider portion of second arm 130. The larger current density in first arm 120 causes first arm 120 to become hotter than second arm 130. For this reason first arm 120 is sometimes referred to as a "hot" arm 120 and second arm 130 is sometimes referred to as a "cold" arm 130. The higher level of heat in first arm 120 causes the thermal expansion of first arm 120 to be greater than the thermal expansion of second arm 130.

Because first arm 120 and second arm 130 are joined at the free end of thermal beam actuator 100 by mechanical link 140, the differential expansion of first arm 120 and second arm 130 causes the free end of thermal beam actuator 100 to move in an arc-like trajectory parallel to the surface of substrate 110. When the electric current is switched off, the heating of first arm 120 and second arm 130 ceases. Then first arm 120 and second arm 130 cool down. As first arm 120 and second arm 130 cool down they return to their equilibrium positions.

The essential requirement for generating deflection in thermal beam actuator 100 is to have one arm expand more than the other arm. Prior art thermal beam actuators such as thermal beam actuator 100 are capable of producing lateral deflections (i.e., deflections parallel to the plane of substrate 110) on the order of five microns (5.0 $\mu$m) with typical drive voltages that are less than seven volts (7.0 v).

FIG. 2 illustrates a schematic plan view of thermal beam actuator 100. Anchor 150 is coupled to electrical connector 210 and anchor 160 is coupled to electrical connector 220. Electrical connector 210 and electrical connector 220 are coupled to a source of electric current (not shown in FIG. 2). Portions of the surface of second arm 130 adjacent to substrate 110 are formed into a plurality of support dimples 230 spaced along the length of second arm 130. The plurality of support dimples 230 position second arm 130 above substrate 110 and serve as near frictionless bearings as second arm 130 moves laterally across the surface of substrate 110. An exemplary placement of the plurality of support dimples 230 along second arm 130 is shown in FIG. 2. Although the support dimples 230 are located under second arm 130, they are shown in FIG. 2 in solid outline (rather than in dotted outline) for clarity.

FIG. 3 illustrates a cross sectional view of thermal beam actuator 100 taken along line A—A of FIG. 2. FIG. 3 shows how second arm 130 is positioned above substrate 110 by the plurality of support dimples 230.

Thermal beam actuator 100 may be constructed using the following typical dimensions. First arm 120 is one hundred ninety microns (190 μm) long, two microns (2 μm) wide, and two microns (2 μm) thick. Flexure portion 180 of second arm 130 is forty microns (40 μm) long, two microns (2 μm) wide, and two microns (2 μm) thick. The remaining portion of second arm 130 is one hundred fifty microns (150 μm) long, fifteen microns (15 μm) wide, and two microns (2 μm) thick. The width of gap 170 determined by mechanical link 140 is two microns (2 μm). Each support dimple 230 is five microns (5 μm) long, five microns (5 μm) wide, and one micron (1 μm) thick. Anchor 150 and anchor 160 are each fifteen microns (15 μm) long and fifteen microns (15 μm) wide. Electrical connector 210 and electrical connector 220 are each one hundred microns (100 μm) long and one hundred microns (100 μm) wide. These dimensions are exemplary. Other dimensions may be used to construct thermal beam actuator 100.

As shown in FIG. 4 and in FIG. 5, thermal beam actuator 100 can be operated in two modes. In the basic "thermo-elastic" mode (illustrated in FIG. 4) electric current is passed through thermal beam actuator 100 from electrical connector 210 to electrical connector 220 (or vice versa). The higher current density in first arm 120 (the narrower hot arm) causes it to heat and expand more than second arm 130 (the wider cold arm). As previously explained, the differential expansion of first arm 120 and second arm 130 causes the free end of thermal beam actuator 100 to move in an arc about flexure portion 180 that is attached to anchor 160. The deflected position of thermal beam actuator 100 is shown in dotted outline 410 in FIG. 4. Switching off the electric current allows thermal beam actuator 100 to return to its equilibrium state.

The alternate "thermo-plastic" mode of operation (illustrated in FIG. 5) is used to create a permanent deformation in first arm 120 (the narrower hot arm) of thermal beam actuator 100. The permanent deformation is accomplished by supplying enough electric current to cause plastic deformation of the polysilicon of first arm 120. In general, the amount of electric current necessary to create a permanent deformation of first arm 120 is slightly higher than the electric current needed to generate the maximum deflection of the end of thermal beam actuator 100. When the electric current is switched off, thermal beam actuator 100 is left permanently "back bent" from its original position due to bowing or buckling of first arm 120. The amount of deformation or "back bending" depends on the amount of over-current that is applied. The "back bent" position of thermal beam actuator 100 is shown in dotted outline 510 in FIG. 5. After back bending, thermal beam actuator 100 can be operated in the basic "thermo-elastic" mode. Back bending is particularly useful for the one time positioning of thermal beam actuator 100 and as a tool for the assembly of complex devices.

FIG. 6 illustrates how a cantilever beam 630 may be used to experimentally measure the force that can be generated at the free end of activated thermal beam actuator 100. Cantilever beam 630 is positioned parallel to second arm 130 and affixed to anchor 640 which is in turn affixed to substrate 110. Cantilever beam 630 is typically five microns (5 μm) wide. One micron (1 μm) square support dimples (not shown) are placed under cantilever beam 630 to support cantilever beam 630 above substrate 110 and to minimize frictional losses as cantilever beam 630 is moved across the surface of substrate 110 by thermal beam actuator 100.

As shown in FIG. 6, second arm 130 of thermal beam actuator 100 is formed having portions that define a pointed tip 610 to facilitate a measurement of the amount of deflection of the free end of thermal beam actuator 100. Similarly, the free end of cantilever beam 630 is formed into a pointed tip 650 to facilitate a measurement of the amount of deflection of cantilever beam 630. Second arm 130 of thermal beam actuator 100 is also formed having portions that define a contact extension 620 for abutting cantilever beam 630 when thermal beam actuator 100 is deflected. The physical gap between contact extension 620 and cantilever beam 630 is typically two microns (2 μm).

FIG. 7 illustrates a deflection scale 710 for measuring the deflection of thermal beam actuator 100 and cantilever beam 630. Deflection scale 710 is fabricated on the surface of substrate 110. The scale marking of deflection scale 710 are typically two microns (2 μm) wide. Deflection scale thermal beam indicator 720 fabricated on the surface of substrate 110 marks the equilibrium position of thermal beam actuator 100. Deflection scale cantilever beam indicator 730 fabricated on the surface of substrate 110 marks the equilibrium position of cantilever beam 630.

Activation of thermal beam actuator 100 causes second arm 130 to deflect toward cantilever beam 630. Deflection of second arm 130 causes contact extension 620 to abut cantilever beam 630 and to deflect cantilever beam 630. The deflection of thermal beam actuator 100 and the deflection of cantilever beam 630 are accurately measured by observing the position of tip 610 and tip 650 on deflection scale 710. In this manner it is possible to measure the magnitude of tip deflection versus applied electric current and power. This information enables one to obtain the amount of force "F" (in micro Newtons) exerted by thermal beam actuator 100 on cantilever beam 630 using the following equation:

$$F = \frac{Eh}{4}\left(\frac{b}{k}\right)^3 d \qquad (1)$$

where "F" is the force applied to cantilever beam 630, "E" is the Young's modulus of elasticity of cantilever beam 630, "h" is the width of cantilever beam 630, "b" is the thickness of cantilever beam 630, "k" is the suspended length of cantilever beam 630, and "d" is the deflection of cantilever beam 630. Equation (1) ignores losses due to friction as cantilever beam 630 moves across the surface of substrate 110.

Consider a thermal beam actuator 100 having the following dimensions. First arm 120 is two hundred microns (200 μm) in length, two microns (2 μm) in width and two microns (2 μm) in thickness. Second arm 130 is one hundred seventy microns (170 μm) in length, fourteen microns (14 μm) in width and two microns (2 μm) in thickness. Flexure portion 180 is thirty microns (30 μm) in length, two microns (2 μm) in width and two microns (2 μm) in thickness. A typical applied voltage of four and three tenths volts (4.3 v) produces an applied current of three and eight tenths milliamps (3.8 mA) and an applied power of sixteen and three tenths milliwatts (16.3). This causes the tip of thermal beam actuator 100 to be deflected by eight microns (8 μm).

When thermal beam actuator 100 deflects cantilever beam 630 by eight microns (8 μm), the value of "d" in Equation (1) is eight microns (8 μm). Equation (1) may then be used to calculate that a deflection of eight microns (8 μm) corresponds to a force of four micro Newtons (4 μN) exerted by thermal beam actuator 100.

An array of thermal beam actuators may be used in applications that require more force than a single thermal beam actuator can supply or when linear motion is required. FIG. 8 provides an example of how a plurality of prior art thermal beam actuators (810, 820, 830, 840, 850) may be grouped together to form a thermal beam actuator array 800. The free end of each thermal beam actuator in array 800 is formed having portions that define a connecting link (860a, 860b, 860c, 860d, 860e) that is coupled to a common mechanical yoke 870. The combined force exerted by the thermal beam actuators in array 800 is exerted on mechanical yoke 870. Mechanical yoke 870 is a critical component in thermal beam actuator array 800 because it combines the motion and the force of the thermal beam actuators in array 800 in a linear deflection. Each thermal beam actuator in thermal beam actuator array 800 comprises a thermal beam actuator 100.

Some micro-electro-mechanical applications may require the use of a single thermal beam actuator instead of an array of thermal beam actuators. There is therefore a need in the art for improvement in the design and construction of thermal beam actuators. In particular, there is a need in the art for a thermal beam actuator that can generate more force than presently existing thermal beam actuators can generate. There is also a need in the art for a thermal beam actuator that can optimize power consumption, tip deflection and generated force.

SUMMARY OF THE INVENTION

The present invention comprises a system and method for providing an improved thermal beam actuator that is capable of providing force to move elements of a micro-electromechanical device. The thermal beam actuator of the present invention is capable of generating a force that is greater than the force that can be generated by prior art thermal beam actuators.

In prior art electrothermal actuators, electric current flows through the hot arm and through the cold arm. Differential thermal expansion of the hot arm and the cold arm deflects the end of the cold arm. The present invention provides an additional hot arm to provide a return path for the electric current so that the cold arm does not conduct electric current. This eliminates the parasitic electrical resistance of the cold arm. Because the cold arm of the present invention does not conduct electric current a more narrow flexure portion of the cold arm may be used. This increases the mechanical efficiency of the thermal beam actuator. The present invention also optimizes power consumption, tip deflection and generated force of the thermal beam actuator.

Accordingly it is an object of the invention to provide a thermal beam actuator that comprises at least two hot arms and a cold arm.

A further object is to provide a thermal beam actuator in which a cold arm of the thermal beam actuator does not conduct electric current.

An additional object of the invention is to provide a thermal beam actuator in which the flexure portion of the cold arm of the thermal beam actuator has a width that is less than the width of a flexure portion of a prior art thermal beam actuator.

An additional object of the invention is to provide a thermal beam actuator in which the flexure portion of the cold arm of the thermal beam actuator has a width that is greater than the width of a flexure portion of a prior art thermal beam actuator.

Another object of the invention is to provide a thermal beam actuator array comprising a plurality of thermal beam actuators in which each thermal beam actuator has at least two hot arms and a cold arm.

A further object of the invention is to provide a bidirectional thermal beam actuator which may be selectively deflected in either of two directions.

Another object of the invention is to provide a bidirectional thermal beam actuator array comprising a plurality of bidirectional thermal beam actuators.

A further object of the invention is to provide a method for operating a thermal beam actuator in which no electric current is conducted through the cold arm of the thermal beam actuator.

Further objects of the invention will become apparent from the description of the invention which follows.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 9 through 15, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged micro-electro-mechanical device.

Thermal beam actuators may be constructed with a variety of different dimensions. For example, the length, width and height of a thermal beam actuator may be selected from a range of values. The width of the flexure portion of the thermal beam actuator may be similarly selected from a range of values.

It has been noted that a design tradeoff exists between the amount of tip deflection and the amount of force generated by a thermal beam actuator. Increasing the length of the "cold" arm of a thermal beam actuator tends to increase the amount of tip deflection but tends to decrease the amount of force delivered by the thermal beam actuator. Conversely, decreasing the length of the "cold" arm tends to increase the force delivered by the thermal beam actuator but tends to decrease the amount of tip deflection.

Prior art thermal beam actuators and prior art arrays of thermal beam actuators have generally been designed to maximize the amount of tip deflection. Consequently, prior art thermal beam actuators generally have not been designed to maximize the amount of delivered force.

Figure 9:
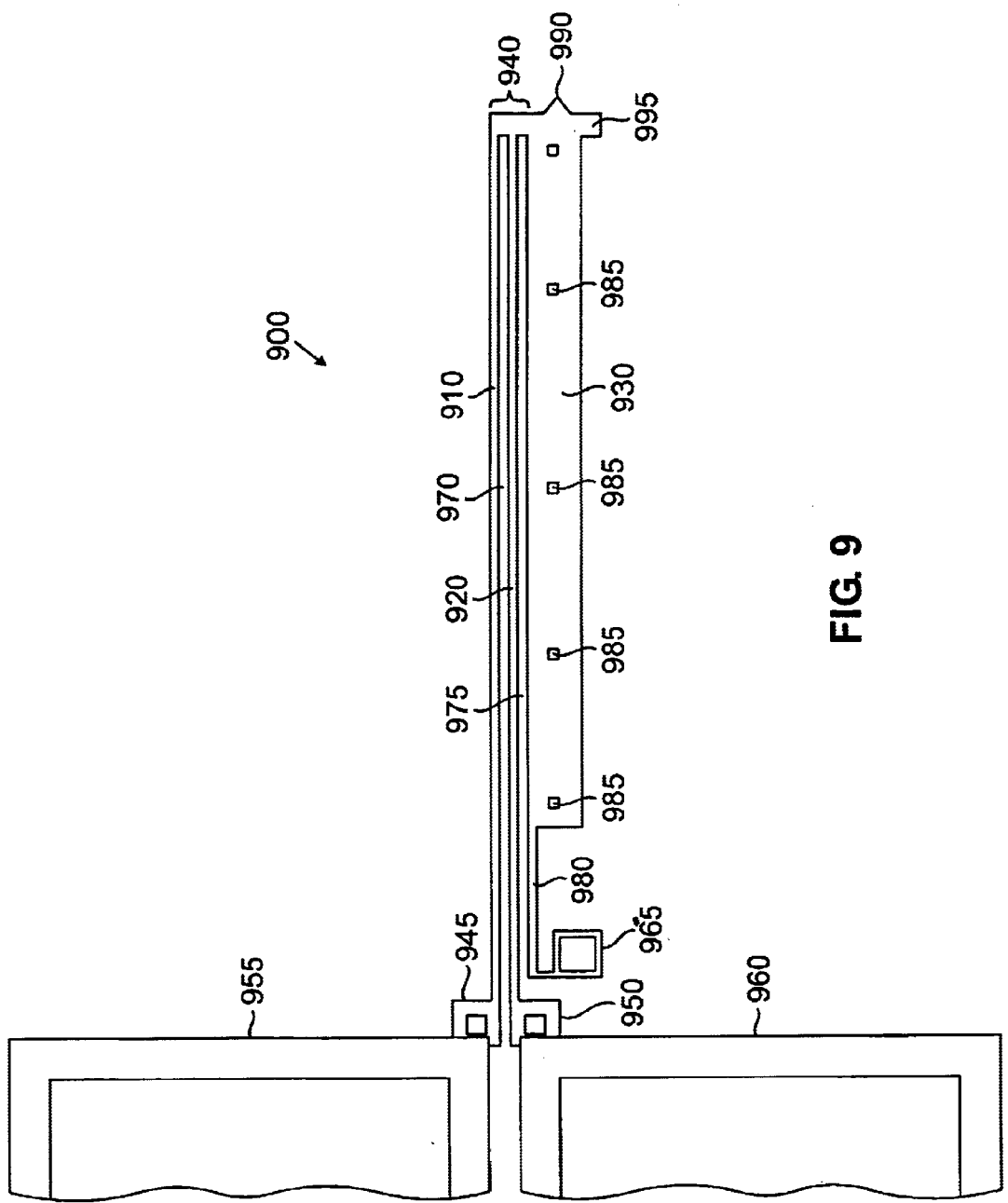
FIG. 9 illustrates a plan view of a thermal beam actuator constructed in accordance with the principles of the present invention.

FIG. 9 illustrates a plan view of an exemplary thermal beam actuator 900 constructed in accordance with the principles of the present invention. Micro-electro-mechanical systems (MEMS) technology is used to form thermal beam actuator 900 from a layer of polysilicon deposited on a dielectric substrate such as silicon nitride (not shown in FIG. 9). The components of thermal beam actuator 900 are formed from a common layer of polysilicon.

Unlike prior art thermal beam actuators that have a single "hot" arm, thermal beam actuator 900 has two "hot" arms. In particular, thermal beam actuator 900 comprises first arm 910 (also referred to as the first "hot" arm 910), second arm 920 (also referred to as the second "hot" arm 920), and third arm 930 (also referred to as the "cold" arm 930). As will be more fully explained, electric current flows through the two hot arms, 910 and 920, but not through the cold arm 930.

As shown in FIG. 9, first hot arm 910, second hot arm 920, and cold arm 930 are joined together at one end with a rigid polysilicon mechanical link 940. The end of thermal beam actuator 900 that comprises mechanical link 940 is able to move laterally and parallel to the surface of the underlying substrate. This end of thermal beam actuator 900 is therefore referred to as the "free" end.

The other end of first hot arm 910 is coupled to anchor 945 and the other end of second hot arm 920 is coupled to anchor 950. Anchor 945 is coupled to electrical connector 955 and anchor 950 is coupled to electrical connector 960. Electrical connector 955 and electrical connector 960 are coupled to a source of electric current (not shown in FIG. 9). The other end of cold arm 930 is coupled to anchor 965 which is coupled to the underlying substrate. This end of thermal beam actuator 900 is therefore referred to as the "fixed" end.

As shown in FIG. 9, thermal beam actuator 900 is formed having portions that define a gap 970 between first hot arm 910 and second hot arm 920. Gap 970 is formed by an interior edge of first hot arm 910 and by an interior edge of second hot arm 920. The width of gap 970 is determined by the width of a first portion of mechanical link 940. Air in gap 970 provides electrical insulation between first hot arm 910 and second hot arm 920.

Similarly, thermal beam actuator 900 is formed having portions that define a gap 975 between second hot arm 920 and cold arm 930. Gap 975 is formed by an interior edge of second hot arm 920 and by an interior edge of cold arm 930. The width of gap 975 is determined by the width of a second portion of mechanical link 940. Air in gap 975 provides electrical insulation between first second hot arm 920 and cold arm 930.

The width of cold arm 930 is greater than the width of first hot arm 910 (and second hot arm 920) for most of the length of thermal beam actuator 900. As shown in FIG. 9, thermal beam actuator 900 is formed having portions that define a flexure portion 980 of cold arm 930. Flexure portion 980 usually has a width that is the same width as first hot arm 910 and the same width as second hot arm 920. In alternate embodiments of the invention, flexure portion 980 may have a width that different than the width of first hot arm 910 and second hot arm 920. The width of flexure portion 980 is selected depending upon the value of the spring constant that is desired for thermal beam actuator 900. A first end of flexure portion 980 is attached to anchor 965 and a second end of flexure portion 980 is attached to the end of the wide portion of cold arm 930 that is adjacent to flexure portion 180.

Electric current (from an electrical source not shown in FIG. 9) may be passed through electrical connector 955, through anchor 945, through first hot arm 910, through mechanical link 940, through second hot arm 920, through anchor 950, through electrical connector 960 and back to the electrical source. Alternatively, electric current (from an electrical source not shown in FIG. 9) may be passed through electrical connector 960, through anchor 950, through second hot arm 920, through mechanical link 940, through first hot arm 910, through anchor 945, through electrical connector 955, and back to the electrical source.

Because anchor 965 is not connected to an electrical connector, the electric current provided to first hot arm 910 and second hot arm 920 does not pass through cold arm 930. The current density in first hot arm 910 and in second hot arm 920 is therefore much greater than the negligible current density (if any) in cold arm 930. The larger current density in first hot arm 910 and in second hot arm 920 causes first hot arm 910 and second hot arm 920 to become hotter than cold arm 930. The higher level of heat in first hot arm 910 and in second hot arm 920 cause first hot arm 910 and second hot arm 920 to expand more than cold arm 930.

Because first hot arm 910 and second hot arm 920 and cold arm 930 are joined at the free end of thermal beam actuator 900 by mechanical link 940, the differential expansion of first hot arm 910 and second hot arm 920 with respect to cold arm 930 causes the free end of thermal beam actuator 900 to move in an arc-like trajectory parallel to the surface of the underlying substrate. When the electric current is switched off, the heating of first hot arm 910 and second hot arm 920 ceases and first hot arm 910 and second hot arm 920 cool down. As first hot arm 910 and second hot arm 920 cool down, first hot arm 910, second hot arm 920 and cold arm 930 return to their equilibrium positions.

Portions of the surface of cold arm 930 adjacent to the underlying substrate are formed into a plurality of support dimples 985 spaced along the length of cold arm 930. The plurality of support dimples 985 position cold arm 930 above the underlying substrate and serve as near frictionless bearings as cold arm 930 moves laterally across the surface of the substrate. An exemplary placement of the plurality of support dimples 985 along cold arm 930 is shown in FIG. 9. Although the support dimples 985 are located under cold arm 930, they are shown in FIG. 9 in solid outline (rather than in dotted outline) for clarity.

Figure 1:
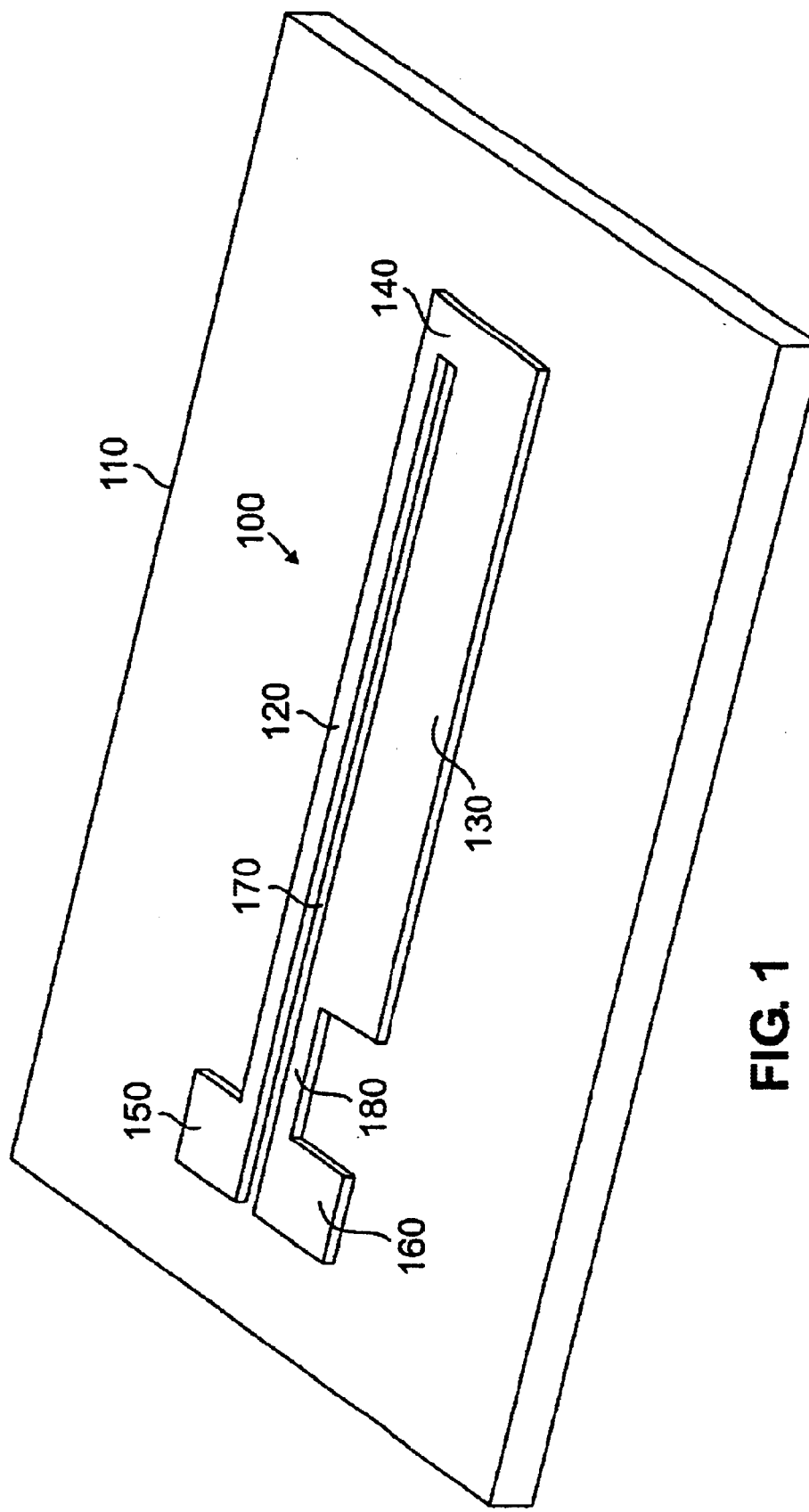
FIG. 1 illustrates a perspective view of a prior art thermal beam actuator.
Figure 2:
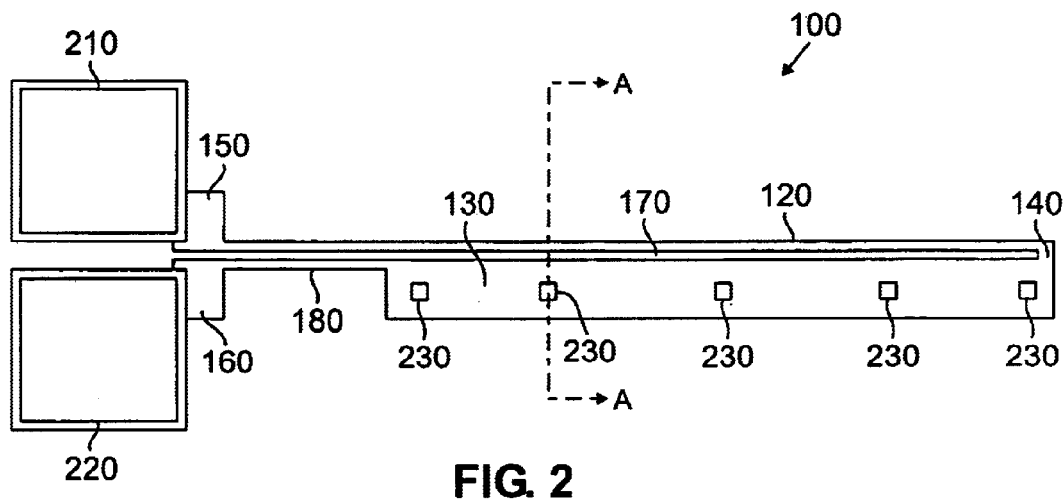
FIG. 2 illustrates a plan view of the thermal beam actuator shown in FIG. 1.
Figure 3:
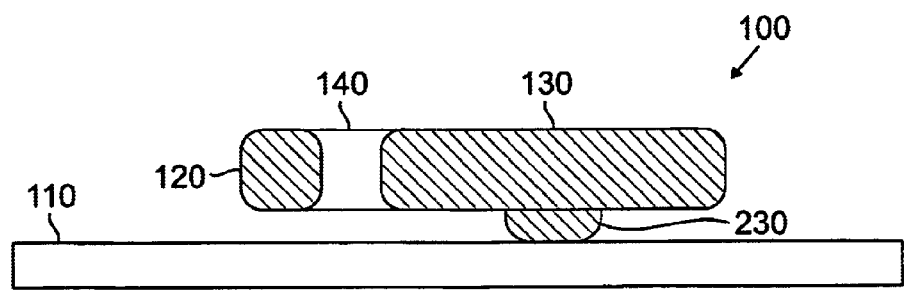
FIG. 3 illustrates a cross sectional view of the thermal beam actuator shown in FIG. 2 taken along line A—A.
Figure 4:
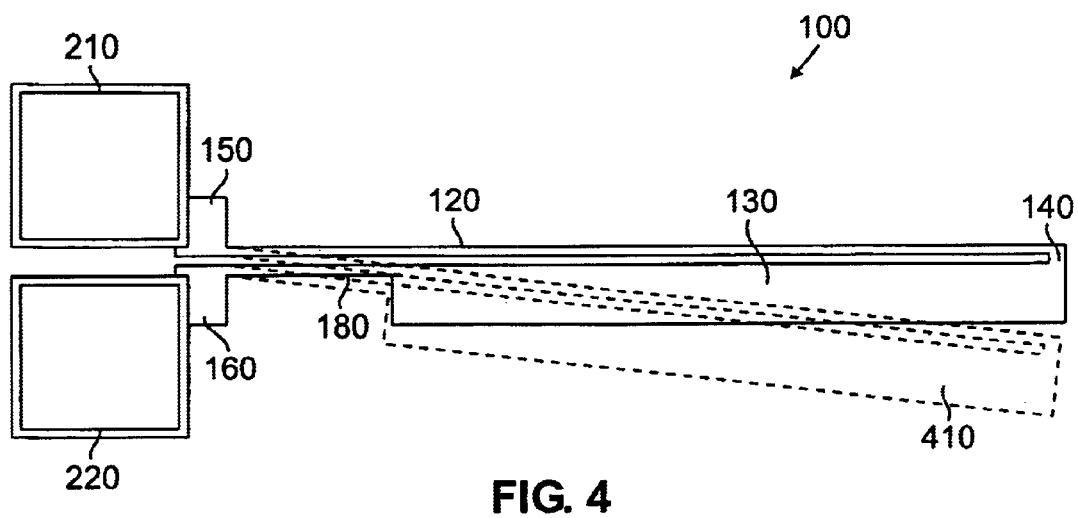
FIG. 4 illustrates a plan view of the thermal beam actuator shown in FIG. 1 showing how a thermal beam actuator may be deflected in a forward direction in a basic "thermoelastic" deflection mode.
Figure 5:
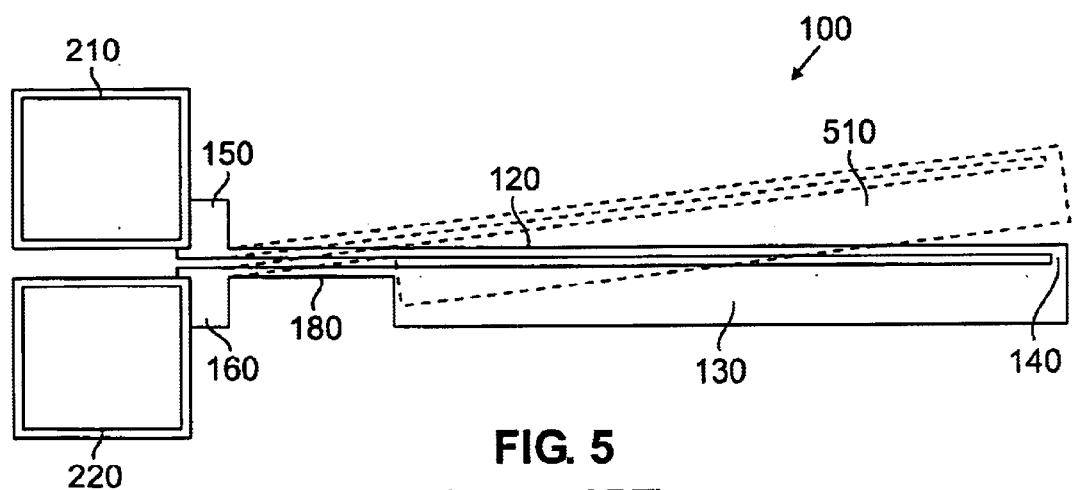
FIG. 5 illustrates a plan view of the thermal beam actuator shown in FIG. 1 showing how a thermal beam actuator may be deflected in a backward direction in an alternate "thermoplastic" deflection mode.
Figure 6:
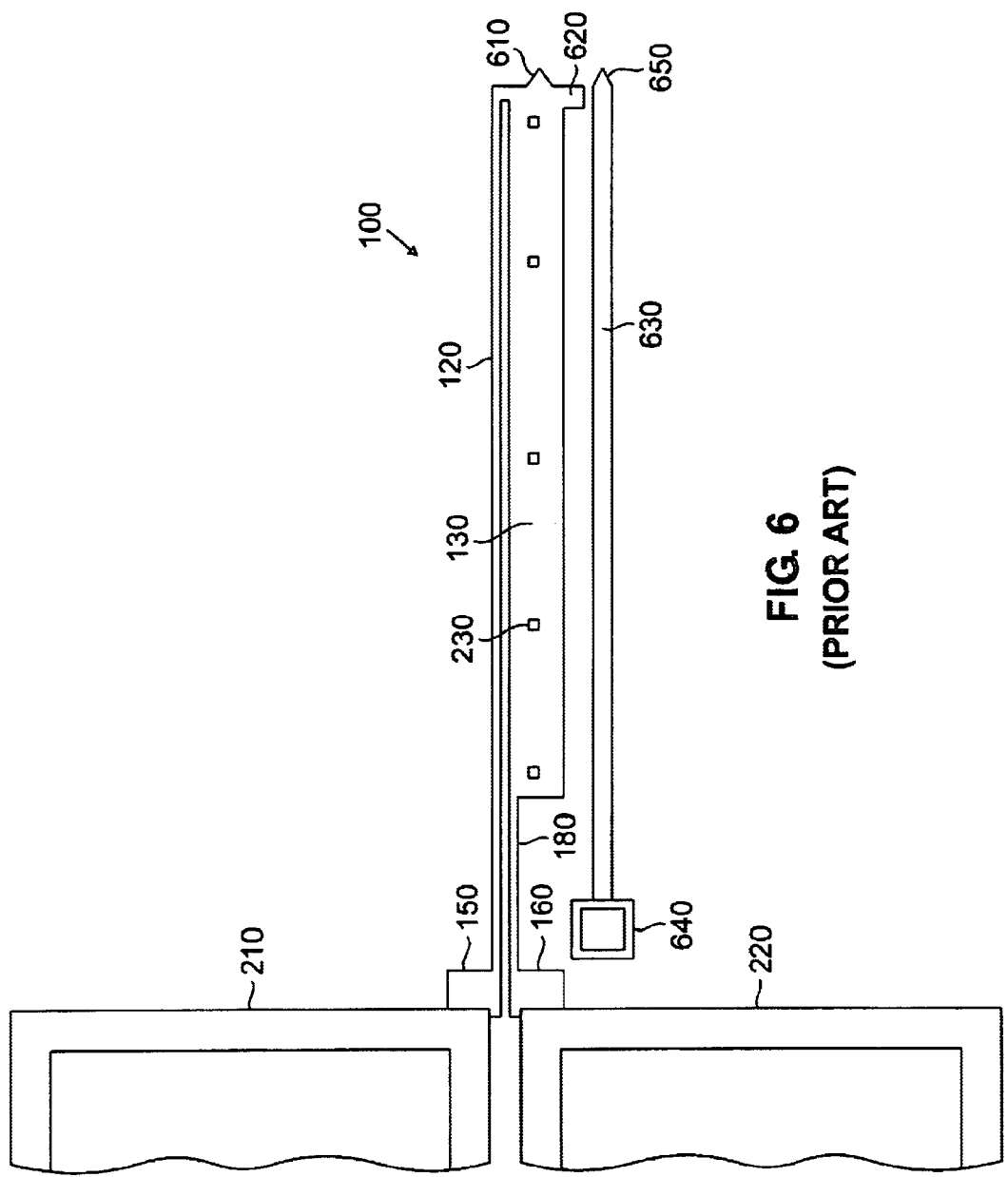
FIG. 6 illustrates a plan view of the thermal beam actuator shown in FIG. 1 and a parallel cantilever beam for measuring lateral deflections of the thermal beam actuator.
Figure 7:
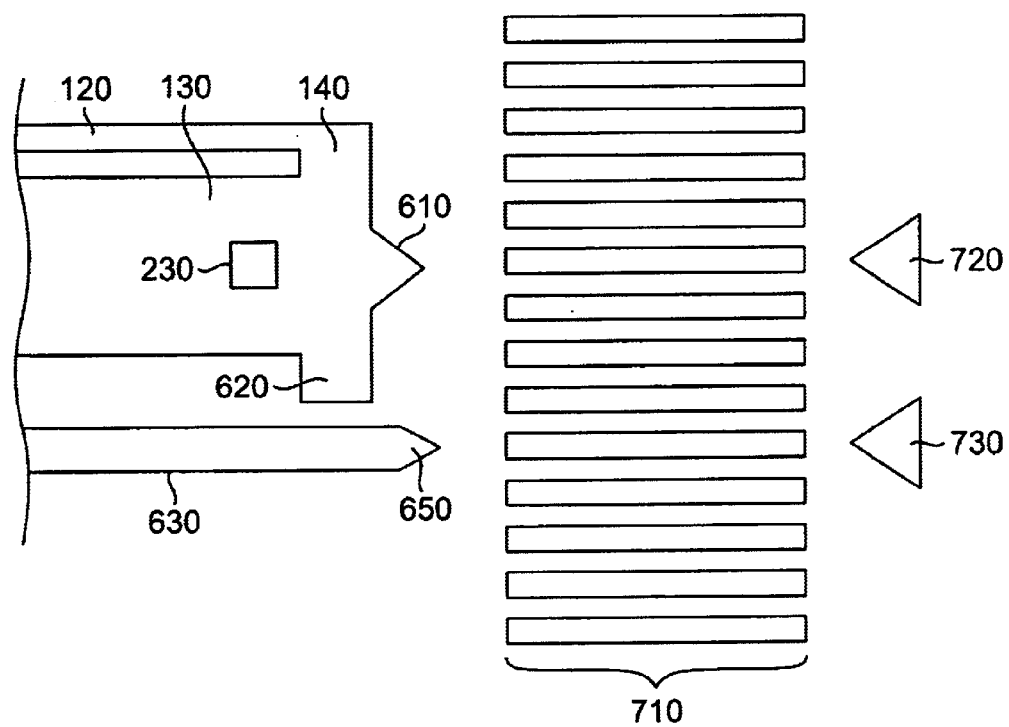
FIG. 7 illustrates an enlarged view of the free end of the thermal beam actuator and the free end of the cantilever beam shown in FIG. 6 and a deflection scale for measuring the deflection of the ends of the thermal beam actuator and the cantilever beam.
Figure 8:
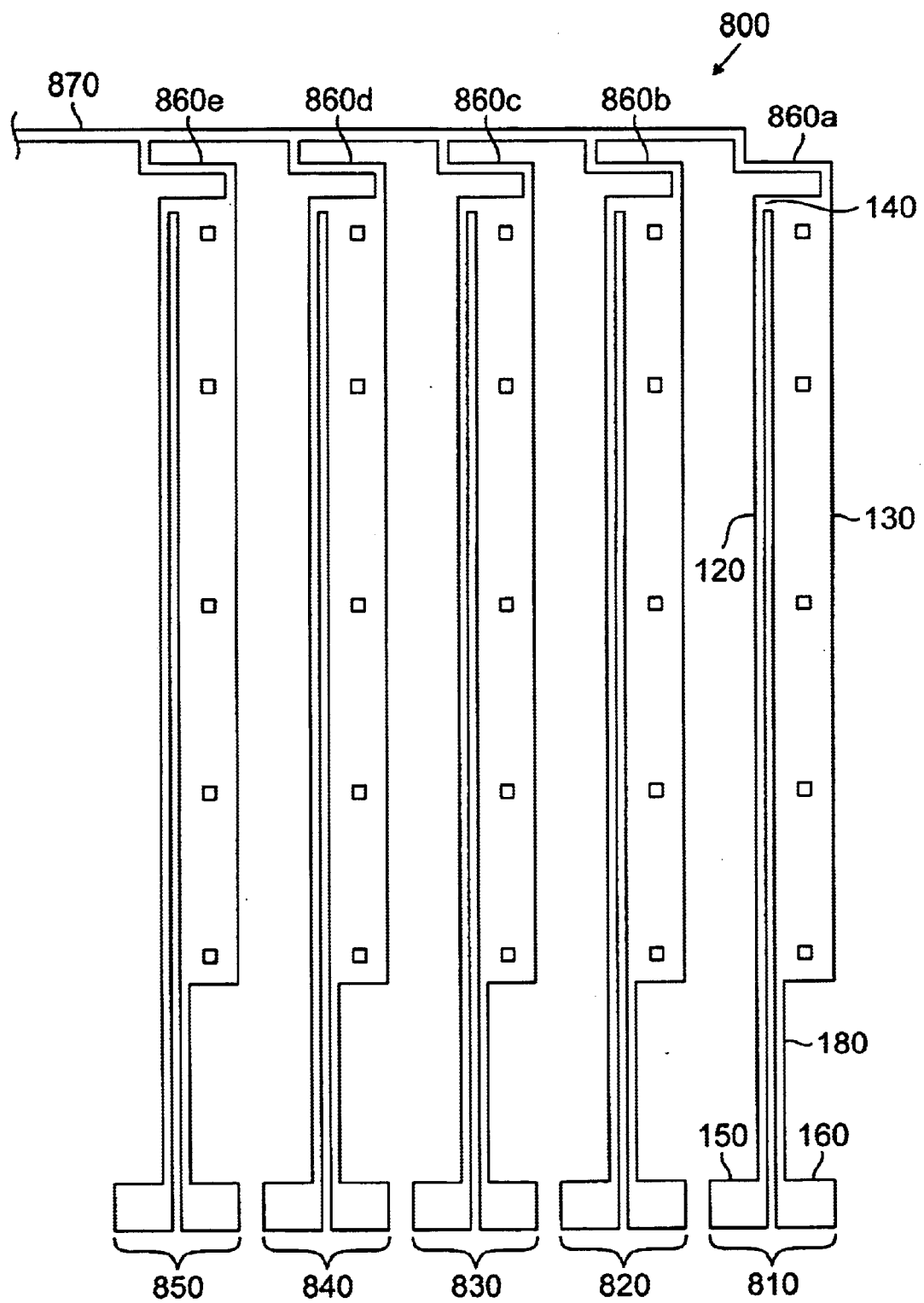
FIG. 8 illustrates a plan view of a thermal beam actuator array comprising a plurality of prior art thermal beam actuators.

The free end of cold arm 930 may also be formed having portions that define a pointed tip 990 to facilitate the measurement of the amount of deflection of thermal beam actuator 900. Pointed tip 990 points to a deflection scale (not shown in FIG. 9) in the manner described with reference to the deflection scale 710 of FIG. 7. Cold arm 930 of thermal beam actuator 900 may also be formed having portions that define a contact extension 995 for abutting a cantilever beam (not shown in FIG. 9) when thermal beam actuator 900 is deflected into a parallel cantilever beam in the manner described with respect to the cantilever beam 630 of FIG. 6 and FIG. 7.

The deflection of thermal beam actuator 900 (and the deflection of an associated cantilever beam) may be accurately measured by observing the position of the pointed tip 990 (and the pointed tip of the associated cantilever beam) on a deflection scale. In this manner it is possible to measure the magnitude of tip deflection versus applied electric current and power for thermal beam actuator 900. As previously described, this information enables one to obtain the amount of force "F" (in micro Newtons) exerted by thermal beam actuator 900 on a parallel cantilever beam using Equation (1).

Electrical current passes through the flexure portion 180 in a prior art thermal beam actuator 100. Electrical current does not pass through the flexure portion 980 in the thermal beam actuator 900 of the present invention. To efficiently perform the flexing function, a flexure portion should be as narrow as possible. A narrower flexure portion (e.g., flexure portion 180) allows more of the force generated by the thermal expansion of the hot arm (e.g., hot arm 120) to cause movement at the tip of the thermal beam actuator (e.g., pointed tip 610 of thermal beam actuator 100). If flexure portion 180 were narrower than hot arm 120, then the temperature of flexure portion 180 would be greater than the temperature of hot arm 120. Under these conditions flexure portion 180 could be destroyed by excessive heat.

In addition, flexure portion 180 needs to be sufficiently long so that it can be elastically deflected by the thermal expansion of the hot arm 120. However, if the flexure portion 180 is too long, then the rotational movement of the tip 610 of the thermal beam actuator 100 will be significantly reduced. This is because a long flexure portion 180 will also expand in length when electric current is applied. This expansion will tend to reduce the desired rotational movement of the end of thermal beam actuator 100.

Consider a prior art thermal beam actuator 100. Flexure portion 180 and cold arm 130 contribute to the overall electrical resistance of thermal beam actuator 100. This is because flexure portion 180 and cold arm 130 complete the electrical circuit for the current that passes through hot arm 120. Flexure portion 180 and cold arm 130 account for approximately twenty five percent (25%) of the net electrical resistance of thermal beam actuator 100.

The electrical power that is dissipated in flexure portion 180 and in cold arm 130 does not contribute to the desired rotational movement of thermal beam actuator 100. Only the electrical power that is dissipated in hot arm 120 directly translates into the intended rotational movement of the thermal beam actuator 100.

Thermal beam actuator 900 of the present invention eliminates the parasitic electrical resistance of cold arm 130 of thermal beam actuator 100 by providing a second hot arm (i.e., second hot arm 920) for a current return path. In an advantageous embodiment of the present invention, second hot arm 920 of thermal beam actuator 900 has the same width as first hot arm 910. Second hot arm 920 carries the electric current that would normally pass through the cold arm 130 (and the flexure portion 180) of a prior art thermal beam actuator 100.

In the present invention, flexure portion 980 of thermal beam actuator 900 can now be narrower than flexure portion 180 of prior art thermal beam actuator 100. This is because flexure portion 980 does not need to carry an electric current. The narrower flexure portion 980 also contributes to the mechanical efficiency of thermal beam actuator 900.

Consider a thermal beam actuator 900 having the following dimensions. First hot arm 910 is two hundred thirty microns (230 $\mu$m) in length, two and one half microns (2.5 $\mu$m) in width and two microns (2 $\mu$m) in thickness. Second hot arm 920 is two hundred thirty microns (230 $\mu$m) in length, two and one half microns (2.5 $\mu$m) in width and two microns (2 $\mu$m) in thickness. Cold arm 930 is one hundred eighty microns (180 $\mu$m) in length, sixteen microns (16 $\mu$m) in width and two microns (2 $\mu$m) in thickness. Flexure portion 980 is fifty microns (50 $\mu$m) in length, two microns (2 $\mu$m) in width and two microns (2 $\mu$m) in thickness. A typical applied voltage of four and three tenths volts (4.3 v) produces an applied current of three and seven tenths milliamps (3.7 mA) and an applied power of fifteen and nine tenths milliwatts (15.9). This causes the tip 990 of thermal beam actuator 900 to be deflected by eight microns (8 $\mu$m).

When thermal beam actuator 900 deflects an adjacent cantilever beam by eight microns (8 $\mu$m) the value of "d" in Equation (1) is eight microns (8 $\mu$m). Equation (1) may then be used to calculate that a deflection of eight microns (8 $\mu$m) of thermal beam actuator 900 corresponds to a force of seven and one half micro Newtons (7.5 $\mu$N) exerted by thermal beam actuator 900.

Figure 10:
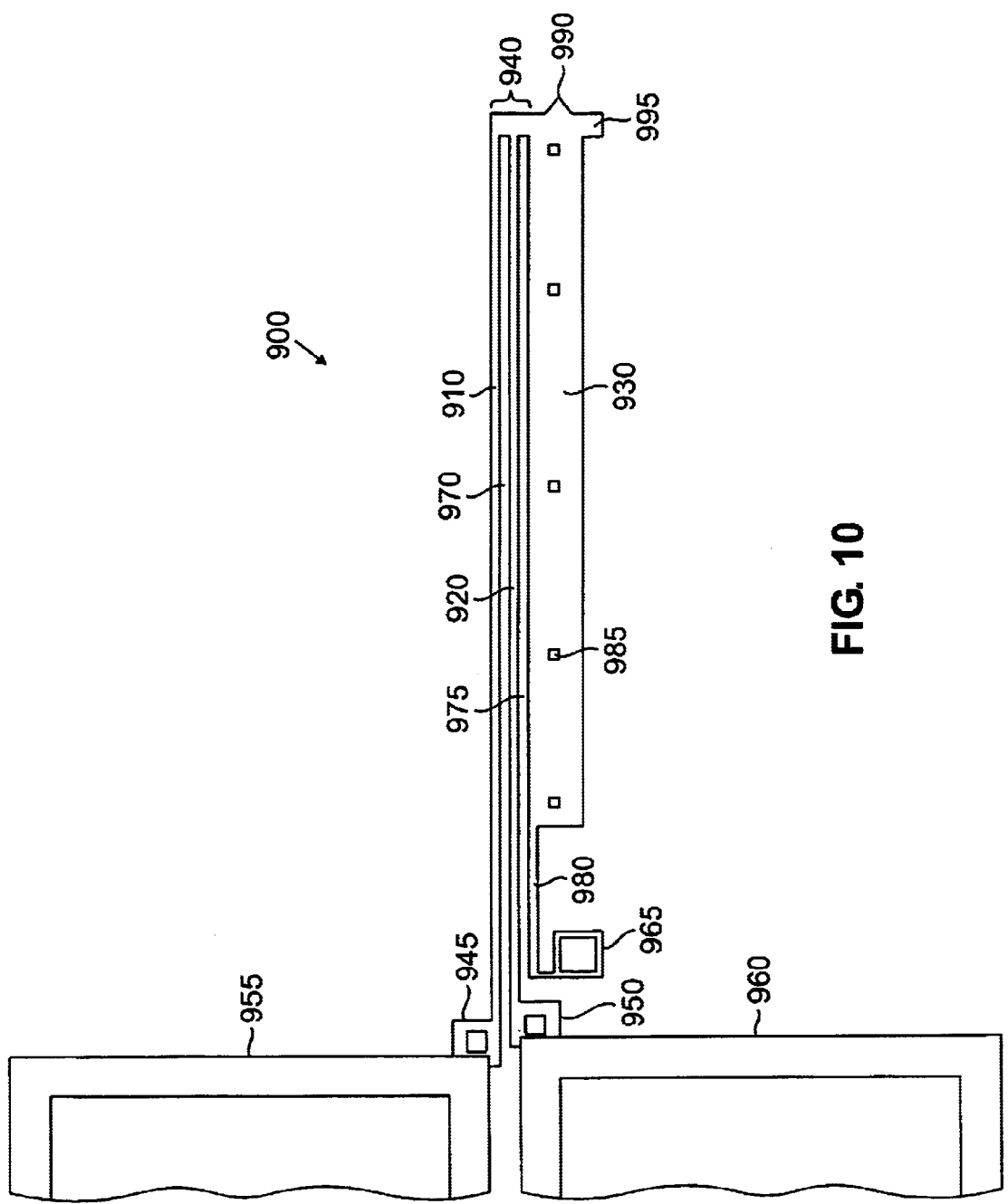
FIG. 10 illustrates a plan view of an alternate advantageous embodiment of a thermal beam actuator constructed in accordance with the principles of the present invention.

In an alternate advantageous embodiment of the present invention, the length of first hot arm 910 (i.e., outer hot arm 910) is slightly longer than the length of second hot arm 920 (i.e., inner hot arm 920). For example, first hot arm 910 may be two hundred fifty microns (250 $\mu$m) in length and second hot arm 920 may be two hundred thirty (230 $\mu$m) in length. This alternate advantageous embodiment is illustrated in FIG. 10. Unlike anchor 945 and electrical connector 955 in FIG. 9, anchor 945 and electrical connector 955 in FIG. 10 are located slightly to the left with respect to anchor 950 and electrical connector 960. This allows the length of first hot arm 910 to be longer than the length of second hot arm 920. The slightly longer length of first hot arm 910 accommodates the rotation of thermal beam actuator 900 by preventing first hot arm 910 from bumping into or overlapping second hot arm 920 during the rotation of first hot arm 910 and second hot arm 920.

Thermal beam actuator 900 comprises a plurality of hot arms (i.e., first hot arm 910 and second hot arm 920). Other embodiments of the thermal beam actuator of the present invention may comprise additional hot arms. That is, the thermal beam actuator of the present invention is not limited to two (2) hot arms. The number of hot arms in a plurality of hot arms may be two (2) or may be greater than two (2).

Figure 11:
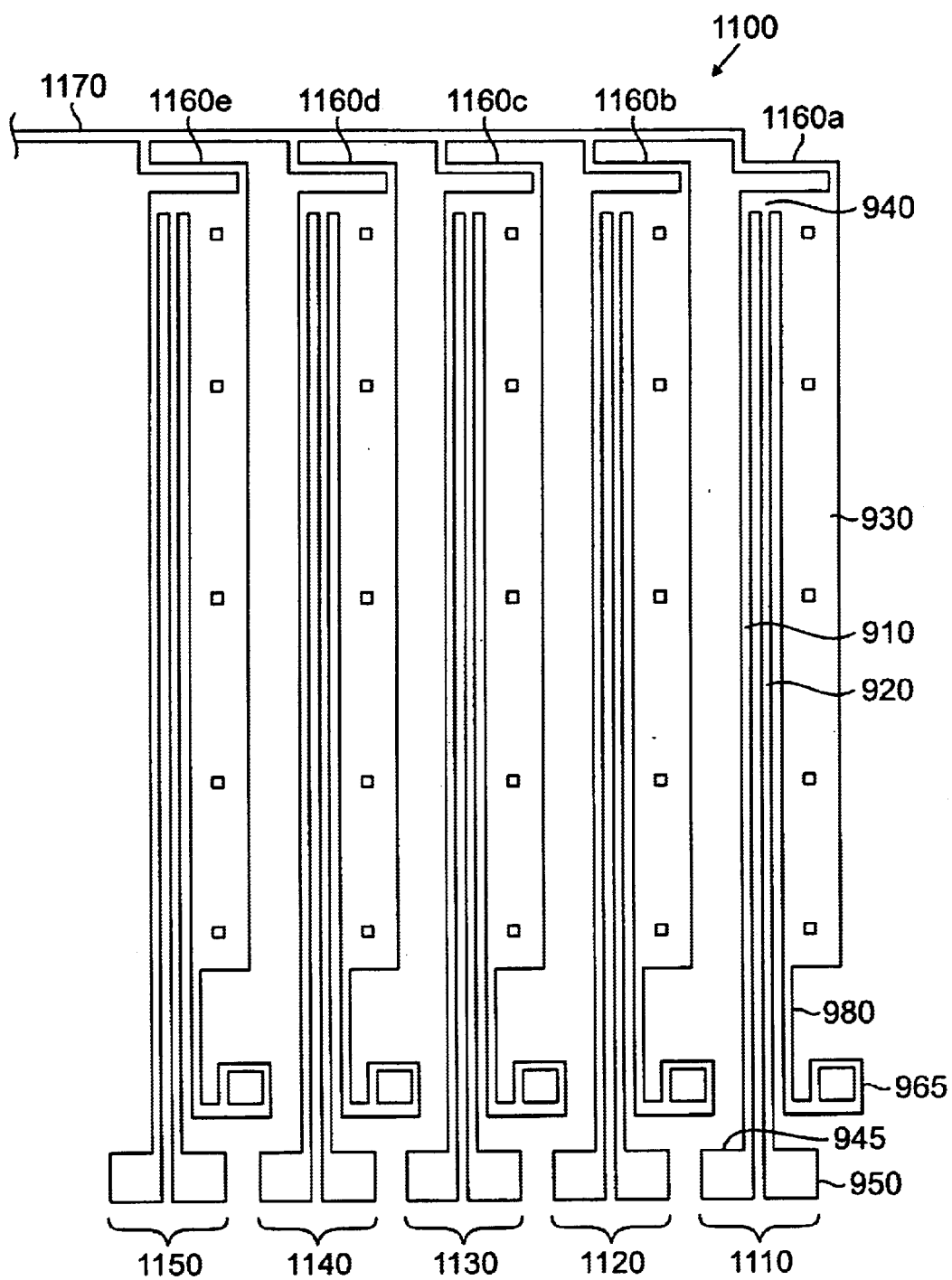
FIG. 11 illustrates a plan view of a thermal beam actuator array comprising a plurality of thermal beam actuators constructed in accordance with the principles of the present invention.

An array of thermal beam actuators of the present invention may be used in applications that require more force than a single thermal beam actuator can supply or when linear motion is required. FIG. 11 provides an example of how a plurality of thermal beam actuators (1110, 1120, 1130, 1140, 1150) of the present invention may be grouped together to form a thermal beam actuator array 1100. The free end of each thermal beam actuator in array 1100 is formed having portions that define a connecting link (1160a, 1160b, 1160c, 1160d, 1160e) that is coupled to a common mechanical yoke 1170. The combined force exerted by the thermal beam actuators in array 1100 is exerted on mechanical yoke 1170. Mechanical yoke 1170 is a critical component in thermal beam actuator array 1100 because it combines the motion and the force of the thermal beam actuators in array 1100 in a linear deflection. Each thermal beam actuator in thermal beam actuator array 1100 is identical in structure to thermal beam actuator 900.

FIG. 11 illustrates a thermal beam actuator array 1100 in which each of the actuators (1110, 1120, 1130, 1140, 1150) in array 1100 have the two hot arms, 910 and 920, on the left hand side, and the cold arm 930 on the right hand side. This arrangement causes the lateral deflection of the actuators to move mechanical yoke 1170 from left to right. An alternate embodiment of array 1100 (not shown) may be constructed in which the actuators in the array 1100 have the two hot arms, 910 and 920, on the right hand side, and the cold arm 930 on the left hand side. This arrangement causes the lateral deflection of the actuators to move mechanical yoke 1170 from right to left.

It is understood that the thermal beam actuator array 1100 shown in FIG. 11 is an example and that the invention is not limited to an array 1100 of exactly five (5) thermal beam actuators. The number of thermal beam actuators in an array may be less than five (5) or greater than five (5).

Figure 12:
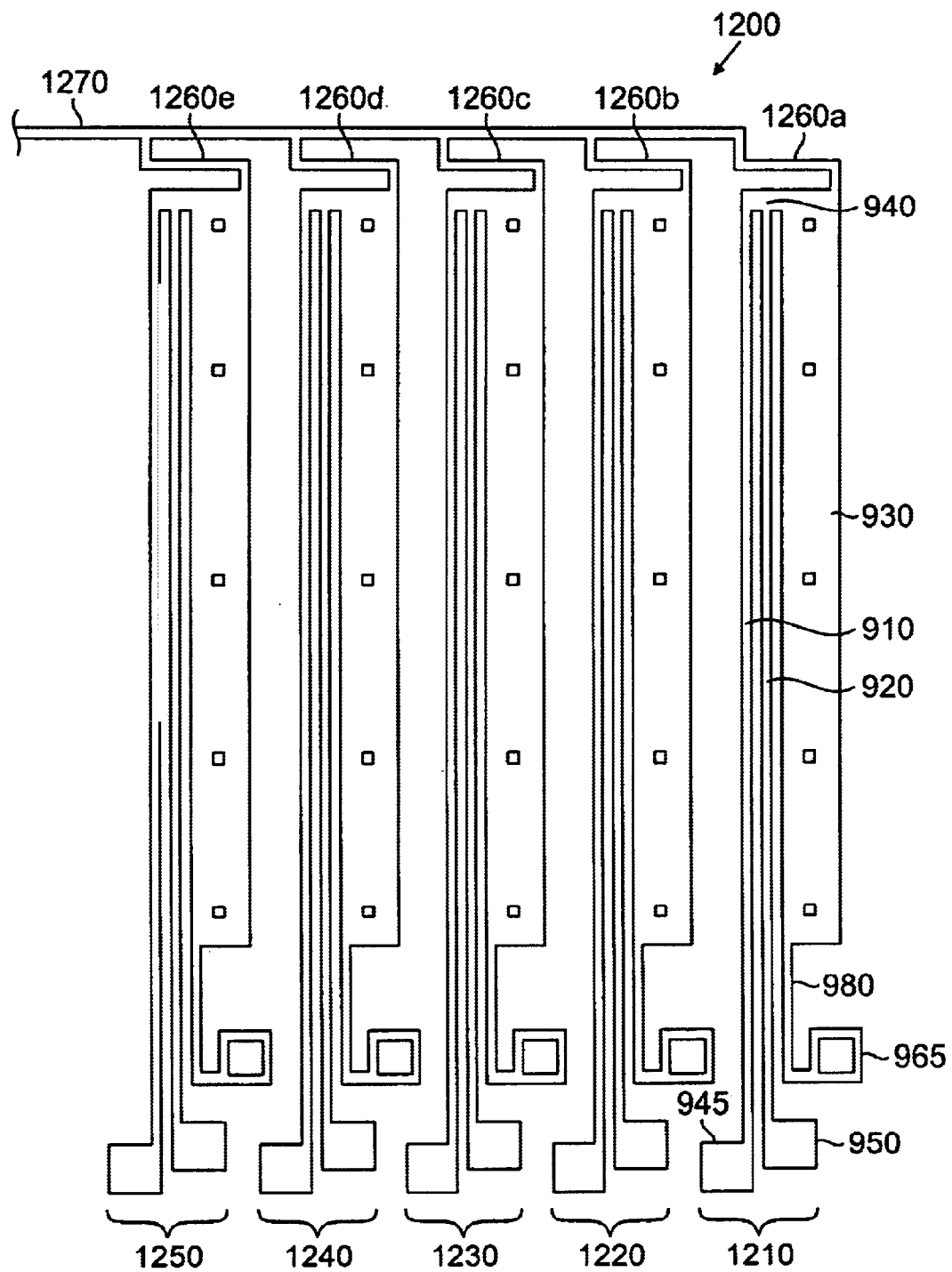
FIG. 12 illustrates a plan view of an alternate advantageous embodiment of a thermal beam actuator array comprising a plurality of thermal beam actuators constructed in accordance with the principles of the present invention.

FIG. 12 illustrates an alternate advantageous embodiment of thermal beam actuator array 1200 in which the length of first hot arm 910 (i.e., outer hot arm 910) in each of the actuators (1210, 1220, 1230, 1240, 1250) is longer than the corresponding second hot arm 920 (i.e., inner hot arm 920). The difference in length is typically between five microns (5 $\mu$m) and twenty microns (20 $\mu$m). In thermal beam actuator array 1200, anchor 945 is not located directly adjacent to anchor 950 (as in FIG. 11), but is located slightly below the level of anchor 950 to allow for the additional length of first hot arm 910. The slightly longer length of first hot arm 910 accommodates the rotation of each thermal beam actuator 900 by preventing first hot arm 910 from bumping into or overlapping second hot arm 920 during the rotation of first hot arm 910 and second hot arm 920.

Figure 13:
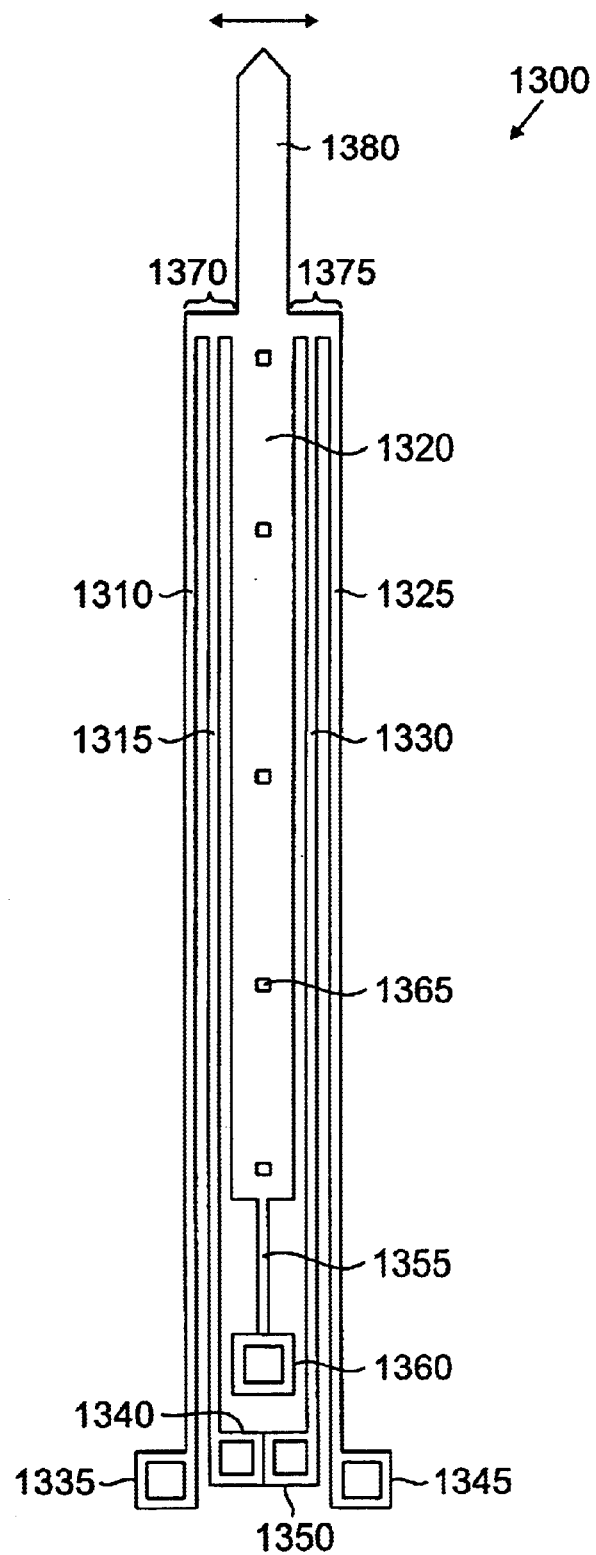
FIG. 13 illustrates a plan view of a bidirectional thermal beam actuator constructed in accordance with the principles of the present invention.

FIG. 13 illustrates a plan view of an alternate advantageous embodiment of the present invention that comprises a thermal beam actuator 1300 that is capable of bidirectional motion. Micro-electro-mechanical systems (MEMS) technology is used to form thermal beam actuator 1300 from a layer of polysilicon deposited on a dielectric substrate such as silicon nitride (not shown in FIG. 13). The components of bidirectional thermal beam actuator 1300 are formed from a common layer of polysilicon.

Bidirectional thermal beam actuator 1300 comprises a first hot arm 1310 and a second hot arm 1315 on a first side of cold arm 1320 and a third hot arm 1325 and a fourth hot arm 1330 on a second side of cold arm 1320. The fixed end of first hot arm 1310 is coupled to anchor 1335, and the fixed end of second hot arm 1315 is coupled to anchor 1340. Anchor 1335 and anchor 1340 are coupled to electrical connectors (not shown in FIG. 13).

Similarly, the fixed end of third hot arm 1325 is coupled to anchor 1345, and the fixed end of fourth hot arm 1330 is coupled to anchor 1350. Anchor 1345 and anchor 1350 are coupled to electrical connectors (not shown in FIG. 13). The flexure portion 1355 of cold arm 1320 is coupled to anchor 1360.

As shown in FIG. 13, first hot arm 1310, second hot arm 1315, and cold arm 1320 are joined together at one end with a rigid polysilicon mechanical link 1370. Third hot arm 1325, fourth hot arm 1330, and cold arm 1320 are joined together at one end with a rigid polysilicon mechanical link 1375. In the advantageous embodiment shown in FIG. 13, an extended portion 1380 of cold arm 1330 extends beyond the juncture where the mechanical links, 1370 and 1375 join the hot arms (1310, 1315, 1325, 1330) to cold arm 1320. The extended portion 1380 of thermal beam actuator 1300 is able to move laterally and parallel to the surface of the underlying substrate. This end of thermal beam actuator 1300 is therefore referred to as the "free" end.

Portions of the surface of cold arm 1320 adjacent to the underlying substrate are formed into a plurality of support dimples 1365 spaced along the length of cold arm 1320. The plurality of support dimples 1365 position cold arm 1320 above the underlying substrate and serve as near frictionless bearings as cold arm 1320 moves laterally across the surface of the substrate. An exemplary placement of the plurality of support dimples 1365 along cold arm 1320 is shown in FIG. 13. Although the support dimples 1365 are located under cold arm 1320, they are shown in FIG. 13 in solid outline (rather than in dotted outline) for clarity.

To move cold arm 1320 of bidirectional thermal beam actuator 1300 laterally toward the right hand side of FIG. 13, electric current (from an electrical source not shown in FIG. 13) may be passed through an electrical connector (not shown) that is coupled to anchor 1335, through first hot arm 1310, through mechanical link 1370, through second hot arm 1315, through anchor 1340, through an electrical connector (not shown) that is coupled to anchor 1340, and back to the electrical source. Alternatively, electric current (from an electrical source not shown in FIG. 13) may be passed through an electrical connector (not shown) coupled to anchor 1340, through anchor 1340, through second hot arm 1315, through mechanical link 1370, through first hot arm 1310, through anchor 1335, through an electrical connector (not shown) coupled to anchor 1335, and back to the electrical source.

Because anchor 1360 is not connected to an electrical connector, the electric current provided to first hot arm 1310 and second hot arm 1315 does not pass through cold arm 1320. The current density in first hot arm 1310 and in second hot arm 1315 is therefore much greater than the negligible current density (if any) in cold arm 1320. The larger current density in first hot arm 1310 and in second hot arm 1315 causes first hot arm 1310 and second hot arm 1315 to become hotter than cold arm 1320. The higher levels of heat in first hot arm 1310 and in second hot arm 1315 cause first hot arm 1310 and second hot arm 1315 to expand more than cold arm 1320.

Because first hot arm 1310 and second hot arm 1315 and cold arm 1320 are joined at the free end of thermal beam actuator 1300 by mechanical link 1370, the differential expansion of first hot arm 1310 and second hot arm 1315 with respect to cold arm 1320 causes the free end of thermal beam actuator 1300 to move in an arc-like trajectory parallel to the surface of the underlying substrate toward the right hand side of FIG. 13. During this process no electric current is passed through third hot arm 1325 and fourth hot arm 1330.

When the electric current is switched off, the heating of first hot arm 1310 and second hot arm 1315 ceases and first hot arm 1310 and second hot arm 1315 cool down. As first hot arm 1310, second hot arm 1315 and cold arm 1320 return to their equilibrium positions.

To move cold arm 1320 of bidirectional thermal beam actuator 1300 laterally toward the left hand side of FIG. 13, electric current (from an electrical source not shown in FIG. 13) may be passed through an electrical connector (not shown) that is coupled to anchor 1345, through anchor 1345, through third hot arm 1325, through mechanical link 1375, through fourth hot arm 1330, through anchor 1350, through an electrical connector (not shown) that is coupled to anchor 1350, and back to the electrical source. Alternatively, electric current (from an electrical source not shown in FIG. 13) may be passed through an electrical connector (not shown) coupled to anchor 1350, through anchor 1350, through fourth hot arm 1330, through mechanical link 1375, through third hot arm 1325, through anchor 1345, through an electrical connector (not shown) coupled to anchor 1345, and back to the electrical source.

Because anchor 1360 is not connected to an electrical connector, the electric current provided to third hot arm 1325 and fourth hot arm 1330 does not pass through cold arm 1320. The current density in third hot arm 1325 and in fourth hot arm 1330 is therefore much greater than the negligible current density (if any) in cold arm 1320. The larger current density in third hot arm 1325 and in fourth hot arm 1330 causes third hot arm 1325 and fourth hot arm 1330 to become hotter than cold arm 1320. The higher levels of heat in third hot arm 1325 and in fourth hot arm 1330 cause third hot arm 1325 and fourth hot arm 1330 to expand more than cold arm 1320.

Because third hot arm 1325 and fourth hot arm 1330 and cold arm 1320 are joined at the free end of thermal beam actuator 1300 by mechanical link 1375, the differential expansion of third hot arm 1325 and fourth hot arm 1330 with respect to cold arm 1320 causes the free end of thermal beam actuator 1300 to move in an arc-like trajectory parallel to the surface of the underlying substrate toward the left hand side of FIG. 13. During this process no electric current is passed through first hot arm 1310 and second hot arm 1315.

When the electric current is switched off, the heating of third hot arm 1325 and fourth hot arm 1330 ceases and third hot arm 1325 and fourth hot arm 1330 cool down. As third hot arm 1325 and fourth hot arm 1330 cool down, third hot arm 1325, fourth hot arm 1330 and cold arm 1320 return to their equilibrium positions.

In this manner bidirectional thermal beam actuator 1300 may be electrothermally actuated to move in either direction. The bidirectional movement is indicated by the double headed arrow at the top of FIG. 13.

Figure 14:
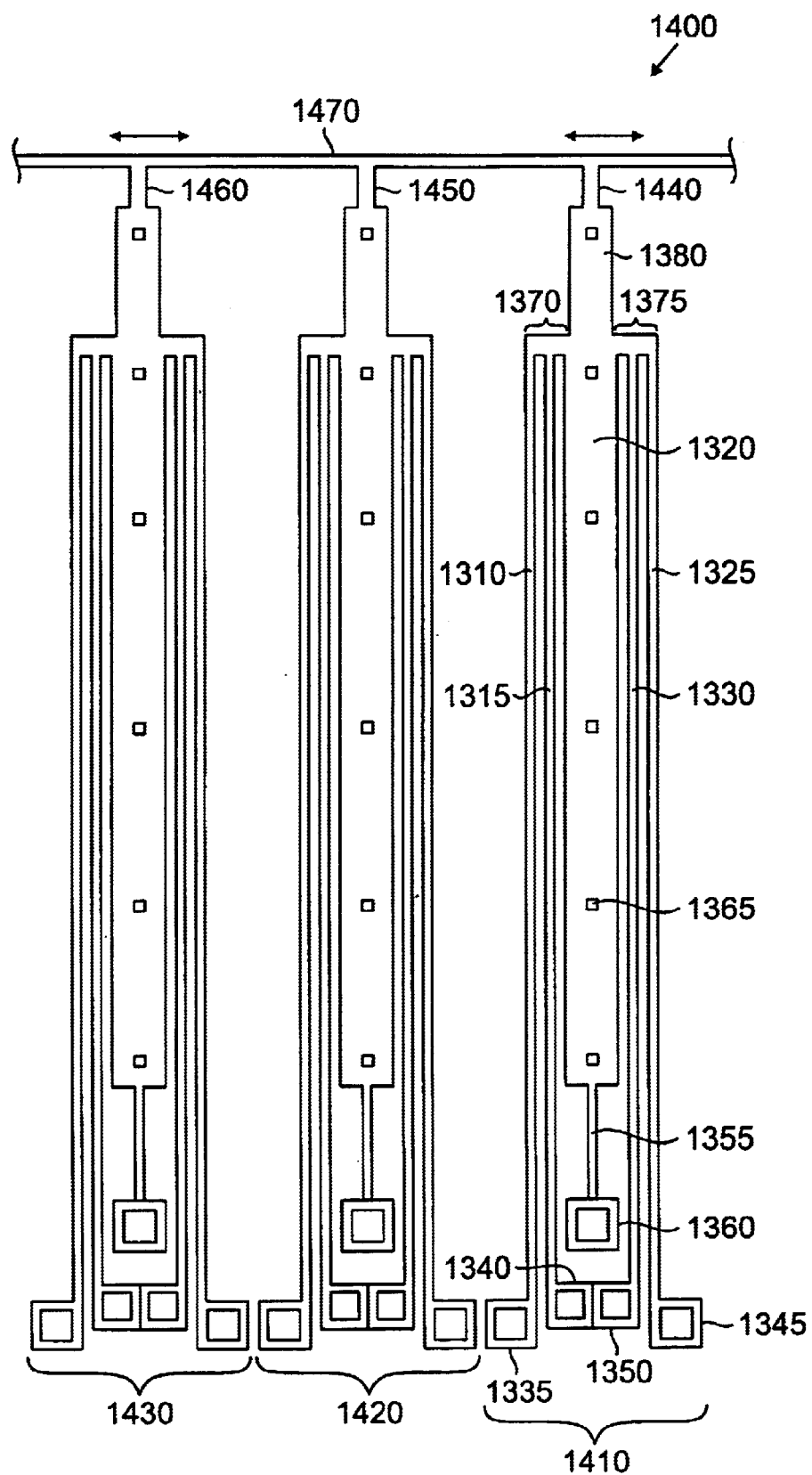
FIG. 14 illustrates a plan view of a thermal beam actuator array comprising a plurality of bidirectional thermal beam actuators constructed in accordance with the principles of the present invention.

FIG. 14 provides an example of how a plurality of bidirectional thermal beam actuators (1410, 1420, 1430) of the present invention may be grouped together to form a bidirectional thermal beam actuator array 1400. The free end of each bidirectional thermal beam actuator in array 1400 is formed having portions that define a connecting link (1440, 1450, 1460) that is coupled to a common mechanical yoke 1470. The combined force exerted by the bidirectional thermal beam actuators in array 1400 is exerted on mechanical yoke 1470. Mechanical yoke 1470 is a critical component in bidirectional thermal beam actuator array 1400 because it combines the motion and the force of the bidirectional thermal beam actuators in array 1400 in a linear deflection. Each bidirectional thermal beam actuator in thermal beam actuator array 1400 is identical in structure to bidirectional thermal beam actuator 1300.

FIG. 14 illustrates a bidirectional thermal beam actuator array 1400 in which each of the actuators (1410, 1420, 1430) in array 1400 have two hot arms, 1310 and 1315, on the left hand side of cold arm 1320 and two hot arms, 1325 and 1330, on the right hand side of cold arm 1320. This arrangement causes the lateral deflection of the actuators to be able to move mechanical yoke 1470 from left to right and from right to left.

It is understood that the bidirectional thermal beam actuator array 1400 shown in FIG. 14 is an example and that the invention is not limited to an array 1400 of exactly three (3) bidirectional thermal beam actuators. The number of bidirectional thermal beam actuators in an array may be less than three (3) or greater than three (3).

Figure 15:
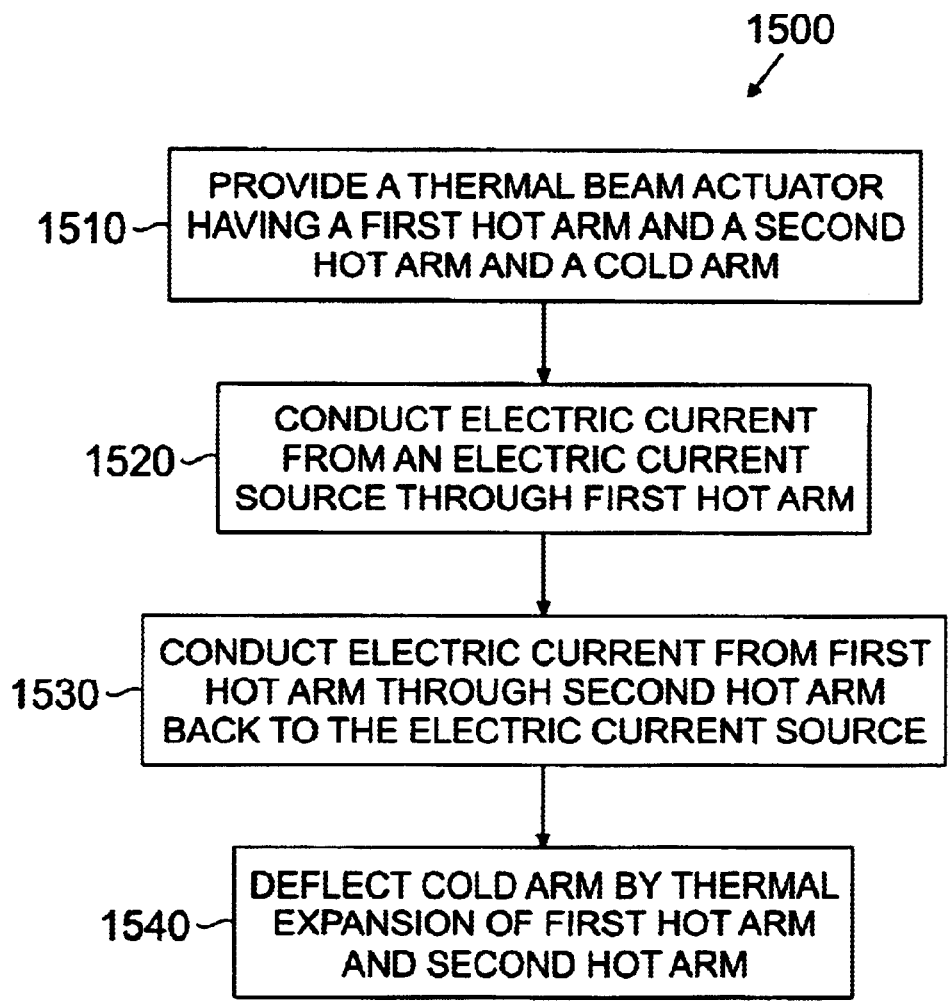
FIG. 15 illustrates a flow diagram of an advantageous embodiment of a method of the present invention.

FIG. 15 illustrates a flow chart of an advantageous embodiment of a method of the present invention for operating an improved electrothermal actuator for a microelectro-mechanical device. The steps of the method shown in FIG. 15 are generally denoted with reference numeral 1500.

An electrothermal actuator 900 having a first hot arm 910 and a second hot arm 920 and a cold arm 930 is provided (step 1510). Electric current is conducted from an electric current source through first hot arm 910 (step 1520). The electric current is then conducted from first hot arm 910 through second hot arm 920 back to the electric current source (step 1530). Cold arm 930 is deflected by thermal expansion of first hot arm 910 and second hot arm 920 (step 1540). As previously discussed, the method of the invention for operating a thermal beam actuator is a method that does not conduct electric current through cold arm 930 (and does not conduct electric current through flexure portion 980 of cold arm 930).

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

What is claimed is:

1. A thermal beam actuator array comprising:
    a plurality of thermal beam actuators in which each thermal beam actuator in said thermal beam actuator array comprises:
        a first hot arm capable of conducting an electric current from an electric current source and capable of thermally expanding when heat is generated in said first hot arm by said electric current;
        a second hot arm coupled to said first hot arm, wherein said second hot arm is capable of conducting said electric current from said first hot arm back to said electric current source and capable of thermally expanding when heat is generated in said second hot arm by said electric current;
        a cold arm coupled to said first hot arm and said second hot arm, wherein said cold arm is capable of being deflected by thermal expansion of said first hot arm and said second hot arm; and a mechanical yoke coupled to an end of each thermal beam actuator in said thermal beam actuator array.

2. A thermal beam actuator array as claimed in claim 1 wherein a width of said first hot arm is equal to a width of said second hot arm in each thermal beam actuator in said thermal beam actuator array.

3. A thermal beam actuator array as claimed in claim 1 wherein a length of said first hot arm is not equal to a length of said second hot arm.

4. A thermal beam actuator array as claimed in claim 1 wherein said each cold arm in each thermal beam actuator in said thermal beam actuator array does not conduct electric current.

5. A thermal beam actuator array as claimed in claim 4 wherein each cold arm in each thermal beam actuator in said thermal beam actuator array comprises portions that form a flexure portion that has a width that is equal to a width of said first hot arm.

6. A thermal beam actuator array as claimed in claim 4 wherein each cold arm in each thermal beam actuator in said thermal beam actuator array comprises portions that form a flexure portion that has a width that is not equal to a width of said first hot arm.

7. A bidirectional thermal beam actuator comprising:
  a first hot arm capable of conducting a first electric current from a first electric current source and capable of thermally expanding when heat is generated in said first hot arm by said first electric current;
  a second hot arm coupled to said first hot arm, said second hot arm capable of conducting said first electric current from said first hot arm back to said first electric current source and capable of thermally expanding when heat is generated in said second hot arm by said first electric current;
  a third hot arm capable of conducting a second electric current from a second electric current source and capable of thermally expanding when heat is generated in said third hot arm by said second electric current;
  a fourth hot arm coupled to said third hot arm, said fourth hot arm capable of conducting said second electric current from said third hot arm back to said second electric current source and capable of thermally expanding when heat is generated in said fourth hot arm by said second electric current; and
  a cold arm coupled to a combination of said first hot arm and said second hot arm and coupled to a combination of said third hot arm and said fourth hot arm, wherein said cold arm is capable of being deflected in a first direction by thermal expansion of said first hot arm and said second hot arm, and wherein said cold arm is capable of being deflected in a second direction by thermal expansion of said third hot arm and said fourth hot arm.

8. A bidirectional thermal beam actuator as claimed in claim 7 wherein a width of said first hot arm is equal to a width of said second hot arm and wherein a width of said third hot arm is equal to a width of said second hot arm.

9. A bidirectional thermal beam actuator as claimed in claim 7 wherein a length of said first hot arm is not equal to a length of said second hot arm.

10. A bidirectional thermal beam actuator as claimed in claim 7 wherein said cold arm does not conduct electric current.

11. A bidirectional thermal beam actuator as claimed in claim 10 wherein said cold arm comprises portions that form a flexure portion that has a width that is equal to a width of said first hot arm.

12. A bidirectional thermal beam actuator as claimed in claim 10 wherein said cold arm comprises portions that form a flexure portion that has a width that is not equal to a width of said first hot arm.

13. A bidirectional thermal beam actuator array comprising:
  a plurality of bidirectional thermal beam actuators in which each bidirectional thermal beam actuator in said bidirectional thermal beam actuator array comprises:
    a first hot arm capable of conducting a first electric current from a first electric current source and capable of thermally expanding when heat is generated in said first hot arm by said first electric current;
    a second hot arm coupled to said first hot arm, said second hot arm capable of conducting said first electric current from said first hot arm back to said first electric current source and capable of thermally expanding when heat is generated in said second hot arm by said first electric current;
    a third hot arm capable of conducting a second electric current from a second electric current source and capable of thermally expanding when heat is generated in said third hot arm by said second electric current;
    a fourth hot arm coupled to said third hot arm, said fourth hot arm capable of conducting said second electric current from said third hot arm back to said second electric current source and capable of thermally expanding when heat is generated in said fourth hot arm by said second electric current; and
    a cold arm coupled to a combination of said first hot arm and said second hot arm and coupled to a combination of said third hot arm and said fourth hot arm, wherein said cold arm is capable of being deflected in a first direction by thermal expansion of said first hot arm and said second hot arm, and wherein said cold arm is capable of being deflected in a second direction by thermal expansion of said third hot arm and said fourth hot arm.

14. A bidirectional thermal beam actuator array as claimed in claim 13 further comprising a mechanical yoke coupled to an end of each bidirectional thermal beam actuator in said bidirectional thermal beam actuator array.

15. A method for operating a thermal beam actuator array comprising the steps of:
  providing a plurality of thermal beam actuators in which each thermal beam actuator comprises at least two hot arms and a cold arm;
  coupling an end of each thermal beam actuator of said plurality of thermal beam actuators to a mechanical yoke;
  conducting an electric current from an electric current source through a first hot arm in each thermal beam actuator of said plurality of thermal beam actuators;
  conducting said electric current from said first hot arm through a second hot arm of each thermal beam actuator of said plurality of thermal beam actuators back to said electric current source; and
  deflecting a cold arm of each thermal beam actuator in said plurality of thermal beam actuators by thermal expansion of a first hot arm and a second hot arm of said each thermal beam actuator.

16. A method for operating a bidirectional thermal beam actuator comprising the steps of:
  conducting a first electric current from a first electric current source through a first hot arm of said bidirectional thermal beam actuator;

conducting said first electric current from said first hot arm through a second hot arm of said bidirectional thermal beam actuator back to said first electric current source;

deflecting a cold arm of said thermal beam actuator in a first direction by thermal expansion of said first hot arm and said second hot arm;

conducting a second electric current from a second electric current source through a third hot arm of said bidirectional thermal beam actuator;

conducting said second electric current from said third hot arm through a fourth hot arm of said bidirectional thermal beam actuator back to said second electric current source; and deflecting said cold arm of said bidirectional thermal beam actuator in a second direction by thermal expansion of said third hot arm and said fourth hot arm.

17. A method for operating a bidirectional thermal beam actuator array comprising the steps of:

providing a plurality of bidirectional thermal beam actuators in which each bidirectional thermal beam actuator comprises at least two hot arms and a cold arm;

coupling an end of each bidirectional thermal beam actuator of said plurality of bidirectional thermal beam actuators to a mechanical yoke;

conducting a first electric current from a first electric current source through a first hot arm in each bidirectional thermal beam actuator of said plurality of bidirectional thermal beam actuators;

conducting said first electric current from said first hot arm through a second hot arm of each bidirectional thermal beam actuator of said plurality of bidirectional thermal beam actuators back to said first electric current source; and deflecting a cold arm of each bidirectional thermal beam actuator in said plurality of bidirectional thermal beam actuators in a first direction by thermal expansion of a first hot arm and a second hot arm of said each bidirectional thermal beam actuator.

18. A method as claimed in claim 17 further comprising the steps of:

conducting a second electric current from a second electric current source through a third hot arm in each bidirectional thermal beam actuator of said plurality of bidirectional thermal beam actuators;

conducting said second electric current from said third hot arm through a fourth hot arm of each bidirectional thermal beam actuator of said plurality of bidirectional thermal beam actuators back to said second electric current source; and deflecting a cold arm of each bidirectional thermal beam actuator in said plurality of bidirectional thermal beam actuators in a second direction by thermal expansion of a third hot arm and a fourth hot arm of said each bidirectional thermal beam actuator.

* * * * *